United States Patent
Oh et al.

(10) Patent No.: US 10,985,170 B2
(45) Date of Patent: Apr. 20, 2021

(54) NON-VOLATILE MEMORY DEVICE AND METHOD FOR FABRICATING THE SAME

(71) Applicant: SK hynix Inc., Gyeonggi-do (KR)

(72) Inventors: Jin-Ho Oh, Gyeonggi-do (KR); Su-Hyun Lee, Gyeonggi-do (KR); Tae-Hong Gwon, Gyeonggi-do (KR); Il-Young Kwon, Seoul (KR); Jin-Ho Bin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/550,375

(22) Filed: Aug. 26, 2019

(65) Prior Publication Data

US 2020/0235113 A1 Jul. 23, 2020

(30) Foreign Application Priority Data

Jan. 23, 2019 (KR) .......................... 10-2019-0008763

(51) Int. Cl.
*H01L 27/11556* (2017.01)
*H01L 27/11582* (2017.01)
*H01L 27/1157* (2017.01)
*H01L 27/11524* (2017.01)

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
CPC ......... H01L 27/11556; H01L 27/11524; H01L 27/1157; H01L 27/11582
See application file for complete search history.

(56) References Cited

U.S. PATENT DOCUMENTS

| | | | | |
|---|---|---|---|---|
| 2015/0137209 | A1* | 5/2015 | Lee | H01L 29/66833 |
| | | | | 257/324 |
| 2017/0047340 | A1* | 2/2017 | Huo | H01L 29/1037 |
| 2017/0077136 | A1* | 3/2017 | Kim | H01L 29/40117 |
| 2018/0083027 | A1* | 3/2018 | Yamabe | H01L 21/02164 |
| 2018/0090329 | A1* | 3/2018 | Kim | H01L 27/11582 |

FOREIGN PATENT DOCUMENTS

KR 1792778 11/2017

\* cited by examiner

*Primary Examiner* — Christine A Enad
(74) *Attorney, Agent, or Firm* — IP & T Group LLP

(57) ABSTRACT

A method for fabricating the three dimensional (3D), non-volatile memory (NVM) device includes: forming a stacked structure including a plurality of interlayer insulating layers and a plurality of first material layers which are alternately stacked; forming at least one channel hole penetrating through the stack structure; forming a second material layer along the at least one channel hole; trimming a surface of the second material layer; oxidizing a whole of the trimmed second material layer to form at least a portion of a charge blocking layer; and forming a charge storage layer and a tunnel insulating layer over the charge blocking layer.

14 Claims, 21 Drawing Sheets

NON-VOLATILE MEMORY DEVICE AND METHOD FOR FABRICATING THE SAME

CROSS-REFERENCE TO RELATED APPLICATIONS

The present application claims priority of Korean Patent Application No. 10-2019-0008763, filed on Jan. 23, 2019, which is incorporated herein by reference in its entirety.

BACKGROUND

1. Field

Exemplary embodiments of the present invention relate to an NVM device and a method for fabricating the same, and more particularly, to an NVM device which includes a stacked structure in which a plurality of memory cells are stacked along a channel extending in a vertical direction, and a method for fabricating the same.

2. Description of the Related Art

An NVM device, for example, a NAND type flash, has been developed in which stored data is retained even if power supply is cut off.

Recently, as improvements in the degree of integration of a two-dimensional NVM device which forms memory cells in a single layer over a semiconductor substrate reach a limit, a variety of three-dimensional (3D), non-volatile memory (NVM) devices are proposed in which memory cells are stacked in multiple layers over a semiconductor substrate. Hence, 3D, NVM devices are relatively new and substantial research is being undertaken to further improve their structure, performance characteristics, reliability, and methods of manufacturing.

SUMMARY

Various embodiments of the present invention are directed to a 3D, NVM device and a method for fabricating the same capable of improving the characteristics of the memory cells, ensuring uniformity of the memory cells and increasing a degree of integration.

In accordance with an aspect of the present invention, a method for fabricating a NVM device is provided which includes: forming a stacked structure including a plurality of interlayer insulating layers and a plurality of first material layers which are alternately stacked; forming at least one channel hole penetrating through the stack structure; forming a second material layer along the at least one channel hole; trimming a surface of the second material layer; oxidizing a whole of the trimmed second material layer to form at least a portion of a charge blocking layer; and forming a charge storage layer and a tunnel insulating layer over the charge blocking layer.

The trimmed second material layer includes at least one first portion and at least one second portion of different thickness, wherein during the oxidizing of the trimmed second material layer, a portion of the first material layer is oxidized, and wherein the portion of the first material layer which is oxidized together with the oxidized second material layer form the charge blocking layer. Each of the first material layer and the second material layer includes a silicon-containing material. Each of the first material layer and the second material layer includes a silicon nitride. The first material layer and the second material layer are formed of the same material, and wherein the portion of the first material layer, which is oxidized, and the oxidized second material layer are formed of the same material. The first material layer and the second material layer are formed of materials different from each other, and wherein the portion of the first material layer which is oxidized and the oxidized second material layer are formed of the same material. The first material layer and the second material layer are formed of materials different from each other, and wherein the portion of the first material layer which is oxidized and the oxidized second material layer are formed of materials different from each other. At least a portion of the surface of the second material layer is angled, and the trimming is performed such that the angled portion of the surface of the second material layer is removed. The trimming is performed using a wet chemical. A planar shape of the channel hole has an angled portion at a predetermined height, and the second material layer formed along the channel hole is angled at a portion corresponding to the angled portion of the channel hole at the predetermined height. The method further comprising: forming a channel pillar filling the channel hole in which the charge storage layer and the tunnel insulating layer are formed; forming a slit after the forming of the channel pillar; removing the first material layer exposed by the slit; and filling a space from which the first material layer is removed with a conductive material for forming a gate electrode. The first material layer includes a conductive material for forming a gate electrode. An oxide of the first material layer has an insulating property, and an oxide of the second material layer has an insulating property.

In accordance with another aspect of the present invention, a method for fabricating a NVM device is provided which includes: forming a stacked structure including a plurality of interlayer insulating layers and a plurality of first material layers which are alternately stacked; forming at least one channel hole penetrating through the stack structure; forming a second material layer along an internal side surface of the at least one channel hole; trimming the second material layer to form a plurality of alternating first and second portions of different thickness; and oxidizing the trimmed second material layer to form a charge blocking layer which includes the oxidized trimmed second material layer and respective portions of the respective first material layers which are oxidized while the trimmed second material layer is oxidized.

In accordance with another aspect of the present invention, a NVM device is provided which may include: a stacked structure including a plurality of interlayer insulating layers and a plurality of gate electrode layers which are alternately stacked; a channel pillar penetrating through the stacked structure; and a tunnel insulating layer, a charge storage layer and a first charge blocking layer which are interposed between the channel pillar and the stacked structure and are arranged from a side closer to the channel pillar, the first charge blocking layer including a first portion having a relatively thick thickness and a second portion having a relatively thin thickness; and a second charge blocking layer interposed between the first charge blocking layer and the gate electrode layer to be in contact with the second portion.

The second charge blocking layer is not present between the first portion and the gate electrode layer. The first charge blocking layer includes an outer sidewall facing the stacked structure and an inner sidewall positioned opposite to the outer sidewall, and wherein the outer sidewall includes an angled portion and the inner sidewall does not include an angled portion. A sum of thicknesses of the first charge blocking layer and the second charge blocking layer is constant. Each of the first charge blocking layer and the second charge blocking layer includes an insulating oxide. The first charge blocking layer and the second charge blocking layer include the same material. The first charge blocking layer and the second charge blocking layer include materials different from each other.

In yet another aspect of the present invention, a system is provided which includes: a memory device for storing data; a host accessing the data stored in the memory device; and a controller for controlling the memory device in response to a request of the host between the host and the memory device, wherein the memory device includes: a stacked structure formed including a plurality of interlayer insulating layers and a plurality of gate electrode layers which are alternately stacked; a channel pillar penetrating through the stacked structure; a tunnel insulating layer, a charge storage layer and a first charge blocking layer which are interposed between the channel pillar and the stacked structure and are arranged from a side closer to the channel pillar, the first charge blocking layer including a first portion having a relatively thick thickness and a second portion having a relatively thin thickness; and a second charge blocking layer interposed between the first charge blocking layer and the gate electrode layer to be in contact with the second portion.

These and other features and advantages of the present invention may be better understood from the following detailed description of preferred embodiments in conjunction with the following drawings.

DETAILED DESCRIPTION

Figure 1A:
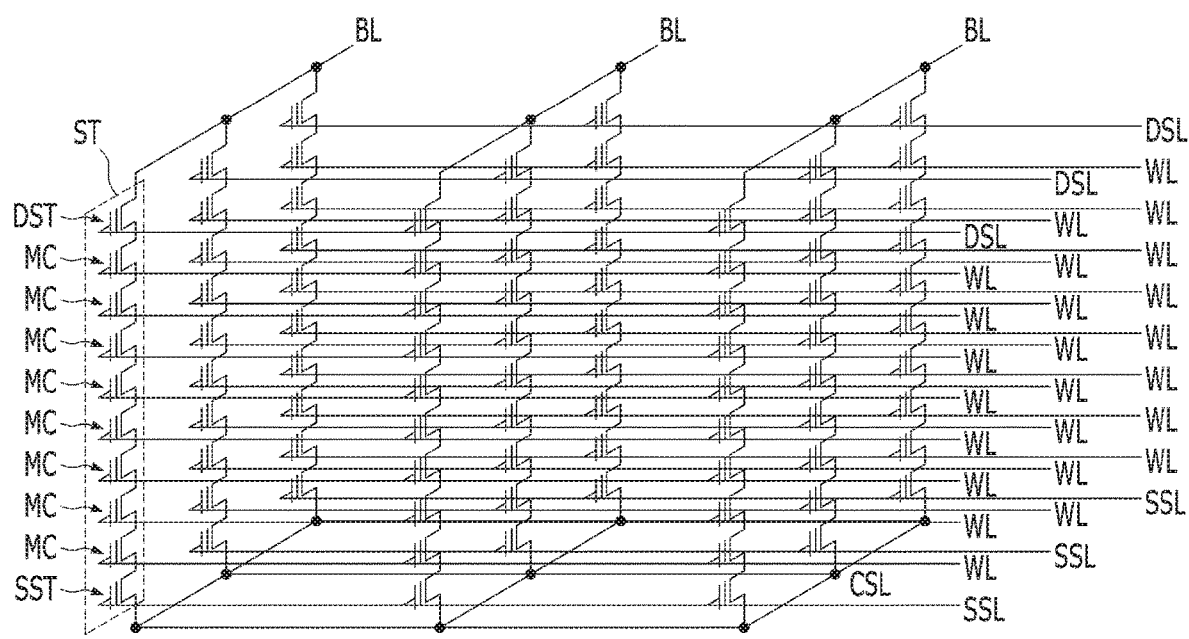
FIG. 1A is a circuit diagram showing an NVM device in accordance with an embodiment of the present disclosure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

As used herein, singular forms are intended to include the plural forms as well, unless the context clearly indicates otherwise.

Figure 1B:
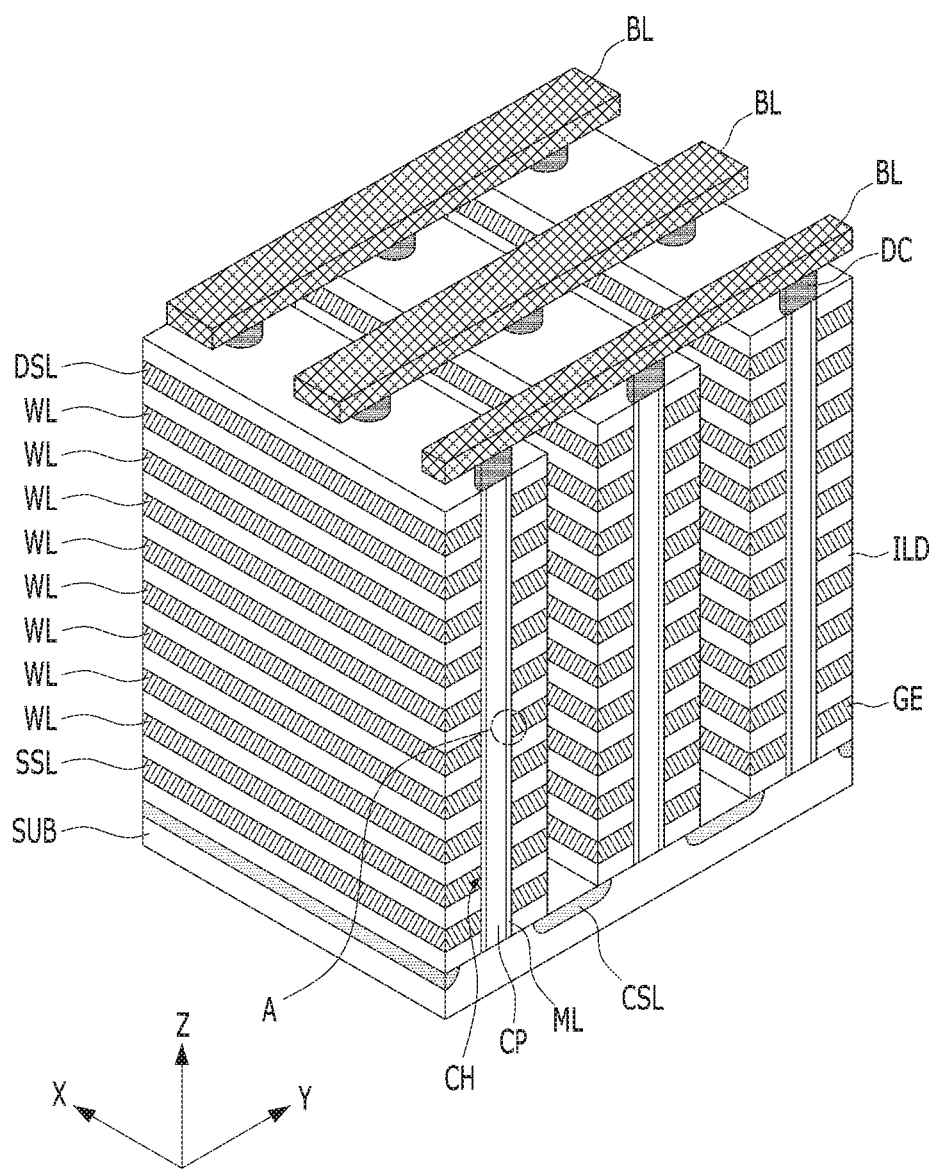
FIG. 1B is a perspective view showing the NVM device of FIG. 1A.
Figure 1C:
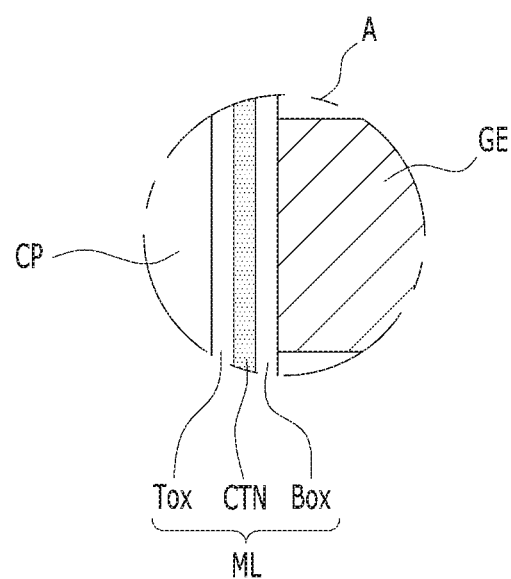
FIG. 1C is an enlarged view of a portion A of FIG. 1B.

FIG. 1A is a circuit diagram showing an NVM device in accordance with an embodiment of the present disclosure, FIG. 1B is a perspective view showing the NVM device of FIG. 1A, and FIG. 1C is an enlarged view of a portion A of FIG. 1B.

Referring to FIG. 1A, the NVM device in accordance with the present embodiment may include a plurality of strings ST, a plurality of bit lines BL, a plurality of word lines WL, a plurality of drain selection lines DSL, a plurality of source selection lines SSL, and a common source line CSL. The number of the strings ST, the number of the bit lines BL, the number of the word lines WL, the number of the drain selection lines DSL, and the number of the source selection lines SSL may not be limited to those shown in this figure, and may be variously modified as needed.

Each string ST may be connected between a respective bit line BL and the common source line CSL. Although three strings ST are connected to each bit line BL in this embodiment, the number of the strings ST connected to each bit line BL may be variously modified. Each of the strings ST may include a source select transistor SST, a plurality of memory cells MC, and a drain select transistor DST which are connected in series. Although eight memory cells MC are connected in series between one source select transistor SST and one drain select transistor DST in the present embodiment, the number of the source select transistor SST, the number of the drain select transistor DST, and the number of the memory cells MC connected between them may be variously modified. In this embodiment, the memory cell MC and the string ST may be a NAND flash memory cell and a NAND string, respectively.

A first junction of the source select transistor SST may be connected to the common source line CSL and a second junction of the source select transistor SST may be connected to a junction of an adjacent memory cell MC (the first memory cell). A gate of the source select transistor SST may be connected to a corresponding source selection line SSL. A first junction of the first memory cell MC may be connected to a junction of the adjacent source select transistor SST and a second junction of the first memory cell MC may be connected to a junction of an adjacent memory cell MC. A first junction of a last memory cell MC may be connected to a junction of an adjacent memory cell MC and a second junction of the last memory cell MC may be connected to a junction of an adjacent drain select transistor DST. Intermediate memory cells MC positioned between the first and last memory cells in a string may have both their junctions connected to respective junctions of adjacent memory cells. A gate of each memory cell MC may be connected to a corresponding word line WL. A second junction of the drain select transistor DST may be connected to a corresponding bit line BL and a first junction of the drain select transistor DST may be connected to a junction of the last memory cell MC. A gate of the drain select transistor DST may be connected to a corresponding drain selection line DSL.

In the NVM device described above, operations such as reading, writing and the like for a selected memory cell MC may be performed by adjusting biases applied to a word line WL connected to the selected memory cell MC, a source selection line SSL and a drain selection line DSL connected to a source select transistor SST and a drain select transistor DST of a string ST including the selected memory cell MC, respectively, and a bit line BL connected to the string ST including the selected memory cell MC. Each of the memory cells MC may store one or more bits. For example, each of the memory cells MC may be used as a single level cell (SLC), or a multi-level cell (MLC) including a two-level cell (often referred to simply in the art as a multi-level cell) or a triple level cell (TLC).

Referring to FIG. 1B, the NVM device of FIG. 1A may be a 3D memory device in which the memory cells MC are arranged and/or stacked in a direction perpendicular to a substrate SUB, referred to herein as a third direction Z.

The substrate SUB may include any suitable semiconductor material such as a silicon containing impurities having a predetermined conductive type, for example, p-type impurities. In the substrate SUB, a common source line CSL doped with impurities having a conductive type different from the substrate SUB, for example, n-type impurities, may be provided. The common source lines CSL may extend in a first direction X and may be arranged apart from each other in a second direction Y. The first and second directions X and Y may define a plane parallel to the plane of the substrate SUB.

A stacked structure in which a plurality of gate electrode layers GE and a plurality of interlayer insulating layers ILD are alternately stacked may be provided over the substrate SUB. The stacked structure may be positioned between adjacent common source lines CSL. The stacked structure may extend in the X direction. A plurality of stacked structures may be arranged apart from each other in the Y direction, each between two adjacent common source lines CSL. The plurality of gate electrode layers GE may function as a source selection line SSL, word lines WL, and a drain selection line DSL. For example, in the present embodiment, the gate electrode layer GE positioned at the lowest position may function as the source selection line SSL, the gate electrode layer GE positioned at the uppermost position may function as the drain selection line DSL, and the remaining gate electrode layers GE may function as the word lines WL.

A channel pillar CP may be provided over the substrate SUB. The channel pillar CP may penetrate through the stacked structure in which the gate electrode layers GE and the interlayer insulating layers ILD are alternately stacked to connect to the substrate SUB. The channel pillars CP may be arranged in a matrix form along the X direction and the Y direction while being located between adjacent common source lines CSL. Each of the channel pillars CP may have a columnar shape extending along the Z direction, and may be formed to include a suitable semiconductor material such as a silicon or the like.

A memory layer ML may be provided between the channel pillar CP and the stacked structure. The memory layer ML may include a triple layer of a tunnel insulating layer Tox, a charge storage layer CTN and a charge blocking layer Box which are sequentially arranged in the stated order in a direction moving away from the external wall of the channel pillar CP (see FIG. 1C). In the present embodiment, the memory layer ML may have a cylindrical shape surrounding an external side surface of the channel pillar CP and extending in the Z direction, but is not limited thereto. The shape of the memory layer ML may be variously modified as long as the memory layer ML is located between the gate electrode layer GE functioning as the word line WL and the channel pillar CP. A gate insulating layer (not shown) different from the memory layer ML may be formed between the gate electrode layer GE functioning as the source selection line SSL and the channel pillar CP and/or between the gate electrode layer GE functioning as the drain selection line DSL and the channel pillar CP.

One channel pillar CP, one word line WL surrounding the one channel pillar CP and the memory layer ML therebetween may form one memory cell MC. One channel pillar CP, one source selection line SSL surrounding the one channel pillar CP and the memory layer ML (or a gate insulating layer not shown) therebetween may form one source select transistor SST. One channel pillar CP, one drain selection line DSL surrounding the one channel pillar CP and a memory layer ML (or a gate insulating layer not shown) therebetween may form one drain select transistor DST. The source selection transistor SST, the memory cells MC, and the drain selection transistor DST stacked along one channel pillar CP may form one string ST.

A drain contact DC may be provided over each of the channel pillars CP. The drain contact DC may include any suitable semiconductor material, such as a silicon, doped with impurities of a predetermined conductivity type, such as n type impurities.

A bit line BL may be provided over the drain contact (DC). A plurality of bit lines BL may be provided each extending in the Y direction and being in contact with the drain contacts aligned in the Y direction with the bit line. The plurality of bit lines may be arranged apart from each other along the X direction. In the illustrated embodiment of FIG. 1B, each bit line is formed over three drain contacts, however, the number of strings and, therefore drain contacts may be designed variously.

Hence, the NVM device of FIG. 1A may be implemented three-dimensionally over the substrate SUB as shown in FIG. 1B, in accordance with an embodiment of the present invention.

Meanwhile, as a degree of integration of a semiconductor memory device increases, the number of the memory cells MC stacked in the Z direction may increase in the NVM device as described above, resulting in various process defects. For example, in order to form the channel pillar CP, a process of forming a channel hole CH by etching the alternately stacked structure of the gate electrode layers GE and the interlayer insulating layers ILD (or an alternately stacked structure of sacrificial layers (not shown) for providing spaces for forming the gate electrode layers GE and the interlayer insulating layers ILD), to a depth at which the substrate SUB is exposed, may be necessary. However, as the height of the stacked structure increases, a burden of etching may become very large, so it may be difficult to perform a normal etching. Particularly, a planar shape of the channel hole CH may be an angular shape instead of a circular shape, thereby causing a problem. This will be described in more detail with reference to FIG. 2.

Figure 2:
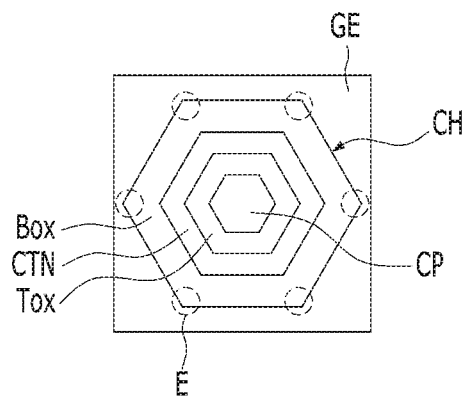
FIG. 2 is a view for explaining a problem that may occur during fabrication of an NVM device.

FIG. 2 is a view for explaining a problem that may occur during fabrication of an NVM device.

Referring to FIG. 2, at least a portion of a channel hole CH may have a polygonal planar shape with a plurality of angled portions (see E), even if the stacked structure is etched using a mask having an opening having a circular planar shape for forming the channel hole CH. Therefore, when the memory layer ML, for example, the charge blocking layer Box, the charge storage layer CTN and the tunnel insulating layer Tox, is deposited in the channel hole CH, the memory layer ML may be deposited along the shape of the channel hole CH to have a planar shape same as or similar to the planar shape of the channel hole CH. That is, outer and inner surfaces of the charge blocking Layer Box, the charge storage layer CTN, and the tunnel insulating layer Tox may be angled. In this case, when biases for operation of the memory cells MC are applied, an electric field may be concentrated on these angular portions, so that characteristics of the memory cells MC may deteriorate.

In addition, a degree of angulation of the channel hole CH may vary depending on the height. That is, a large number of angled portions may be generated in the channel hole CH at a certain height, but a small number of angled portions may be formed or the angled portions may not be formed in the channel hole CH at other heights. Accordingly, the characteristics of the memory cells MC in a string may vary based on its position within the string and therefore the uniformity of the characteristics of the memory cells MC may deteriorate.

The present invention is directed to a method for fabricating a 3D, NVM device to solve this problem and to the NVM device fabricated by the method.

For convenience of explanation, FIG. 2 shows a case where the channel hole CH has a hexagonal planar shape at a predetermined height. However, as long as the channel hole CH has an angled portion at a predetermined height, the planar shape of the channel hole CH may be variously modified. For example, the channel hole CH may have a polygonal shape other than the hexagonal shape, or a shape similar to a star in a different height of the string.

FIGS. 3A to 10B are diagrams explaining a method for fabricating an NVM device in accordance with an embodiment of the present disclosure. FIGS. 3A, 4A, 5A, 6A, 7A, 8A, 9A and 10A are cross-sectional views taken along a line B-B' of FIGS. 3B, 4B, 5B, 6B, 7B, 8B, 9B and 10B, respectively. Also, FIGS. 3B, 4B, 5B, 6B, 7B, 8B, 9B and 10B are planar views taken along a line A-A' of FIGS. 3A, 4A, 5A, 6A, 7A, 8A, 9A and 10A, respectively.

Figure 3A:
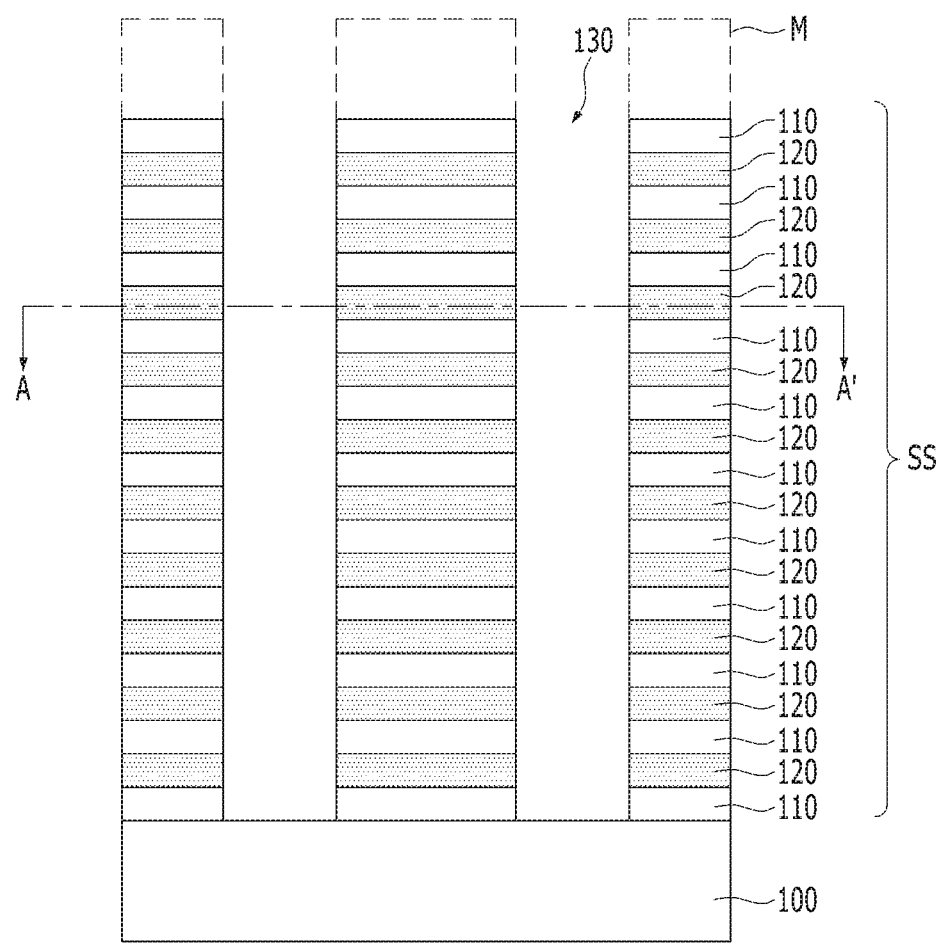
FIGS. 3A to 10B are diagrams explaining a method for fabricating an NVM device in accordance with an embodiment of the present disclosure.
Figure 3B:
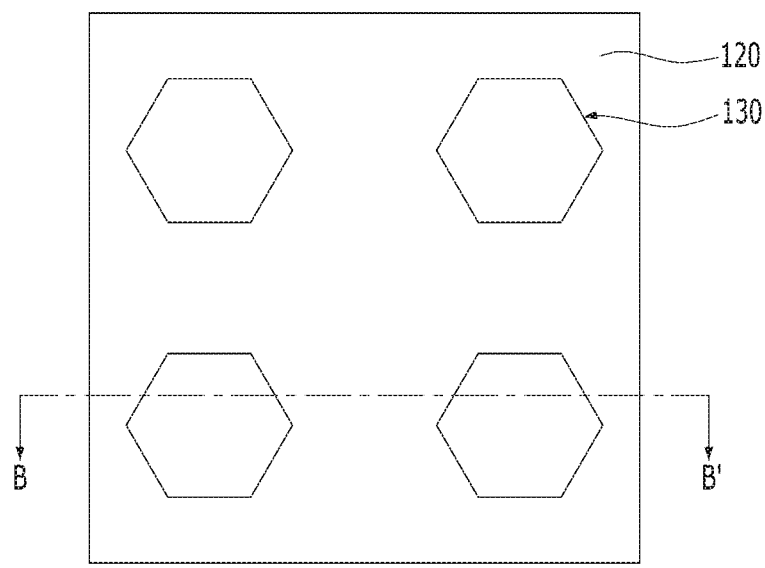
Figure 3C:
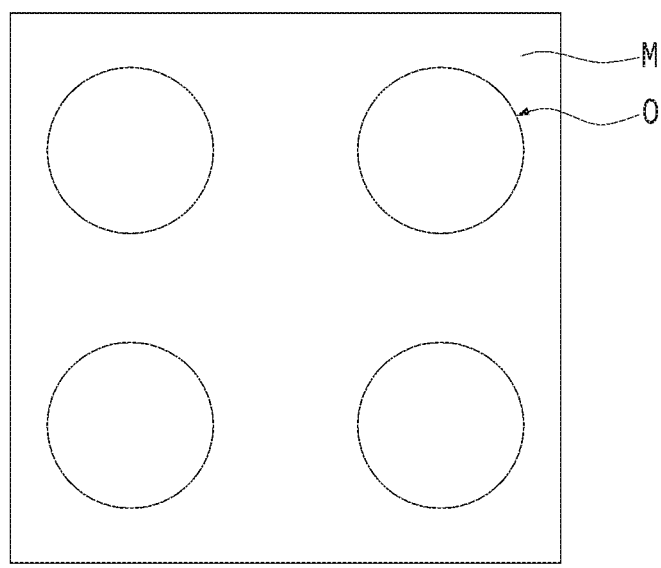

Referring to FIGS. 3A and 3B, a substrate 100 may be provided. The substrate 100 may comprise a semiconductor material such as a silicon. In addition, a desired lower structure (not shown) may be formed in the substrate 100. As an example, the substrate 100 may include a source region (not shown). Alternatively, as an example, the substrate 100 may include a connecting member (not shown) which is coupled to a pair of channel pillars to connect them with each other.

Next, a stacked structure SS in which a plurality of interlayer insulating layers 110 and a plurality of sacrificial layers 120 are alternately stacked may be formed over the substrate 100. The sacrificial layer 120 may be a layer to be replaced with a gate electrode of a memory cell in a subsequent process and may be formed of a material having an etching rate different from that of the interlayer insulating layer 110. This is to prevent the interlayer insulating layer 110 from being lost in a subsequent process of removing the sacrificial layer 120. In addition, the sacrificial layer 120 may be formed of a material having an insulating property by oxidation. That is, an oxide of the sacrificial layer 120 may have an insulating property. This is because an oxidized portion of the sacrificial layer 120 functions as a charge blocking layer when a portion of the sacrificial layer 120 is oxidized in a subsequent oxidation process for forming the charge blocking layer. As an example, the sacrificial layer 120 may comprise a silicon-containing material such as a silicon nitride, a silicon germanium, a polysilicon, and the like. The interlayer insulating layer 110 may be formed to insulate the gate electrodes of adjacent memory cells in a height direction from each other, and may include an insulating material such as a silicon oxide, a silicon nitride, a silicon oxynitride, or a combination thereof.

Next, the stacked structure SS may be selectively etched to form a channel hole 130 which penetrates through the stacked structure SS to expose a portion of the substrate 100.

The channel hole 130 may provide a space in which a channel pillar is to be formed, and may be variously arranged. For example, the channel holes 130 may be arranged in a matrix form along a direction parallel to the B-B' line and a direction intersecting the B-B' line direction. Here, the selective etching of the stacked structure SS may be performed using a mask pattern M having an opening portion O exposing a region where the channel hole 130 is to be formed, and the opening portion O may have a circular shape (see FIG. 3C). Even if the opening portion O of the mask pattern M has a circular shape, the planar shape of the channel hole 130 may be changed according to a height in the etching process. For example, as shown, the channel hole 130 may have a hexagonal shape in a plan view at a height corresponding to the line A-A' of FIG. 3A. However, the present embodiment is not limited thereto, and the channel hole 130 may have various planar shapes in which one or more angular portions exist at a predetermined height.

Figure 4A:
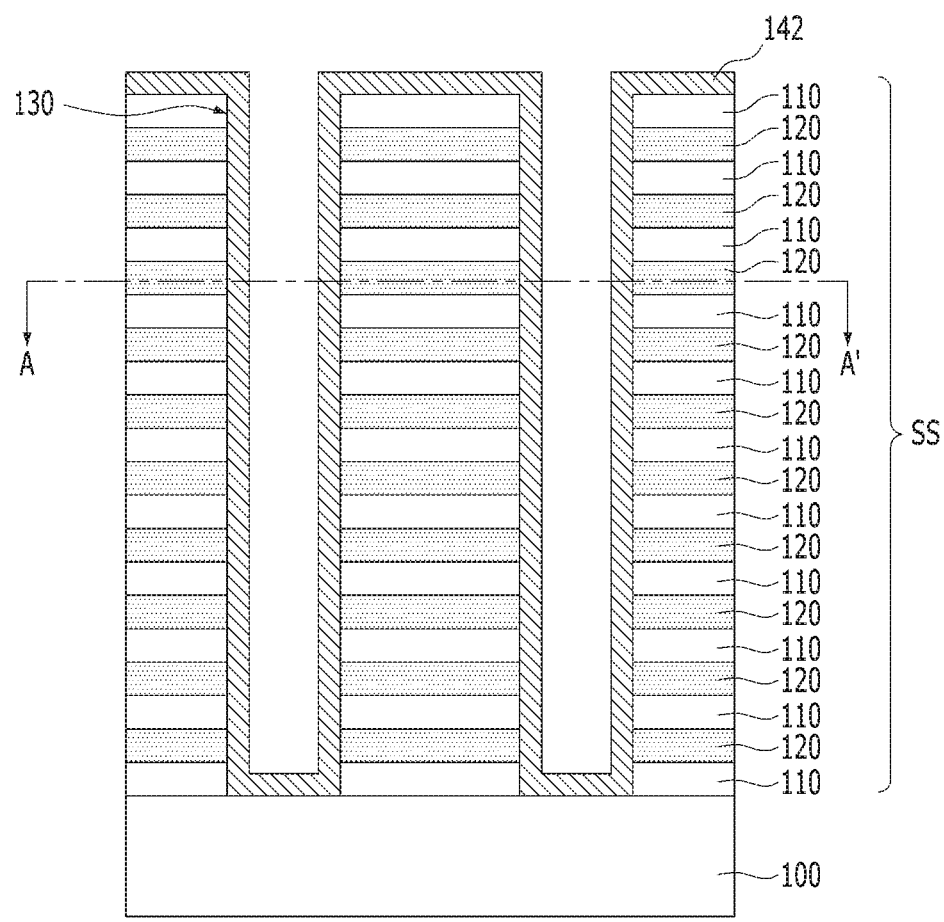
Figure 4B:
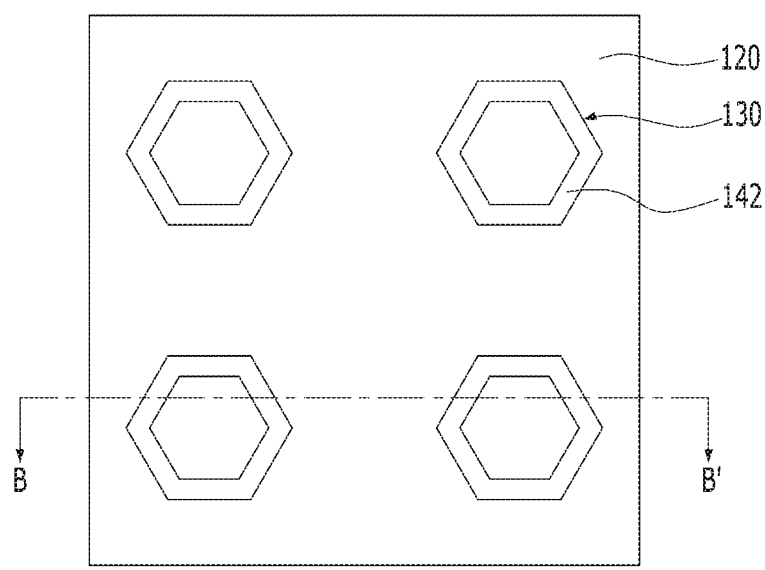

Referring to FIGS. 4A and 4B, a first initial charge blocking layer 142 may be formed along a surface of the stacked structure SS having the channel hole 130 formed therein. The first initial charge blocking layer 142 may ultimately be used as a charge blocking layer or a portion thereof may ultimately be used as a charge blocking layer through a trimming process of FIGS. 5A and 5B and an oxidation process of FIGS. 6A and 6B. The first initial charge blocking layer 142 may be formed of a material having an insulating property by oxidation. As an example, the first initial charge blocking layer 142 may comprise a silicon-containing material such as a silicon nitride, a silicon germanium, a polysilicon, or the like, which can be transformed into a silicon oxide by oxidation. As an example, the first initial charge blocking layer 142 and the sacrificial layer 120 may be formed of the same material, for example, a silicon nitride. However, the present embodiment is not limited thereto, and the first initial charge blocking layer 142 and the sacrificial layer 120 may be formed of materials different from each other.

Since the first initial charge blocking layer 142 is formed along the surface of the channel hole 130, the shape of the channel hole 130 may be reflected in the first initial charge blocking layer 142. Accordingly, for example, as shown, outer and inner sidewalls of the first initial charge blocking layer 142 may have a hexagonal shape in a plan view. For reference, the outer sidewall may mean a sidewall contacting the stacked structure SS, and the inner sidewall may mean a sidewall opposite to the outer sidewall. When the channel hole 130 has another shape having one or more angled portions, the outer sidewall and the inner sidewall of the first initial charge blocking layer 142 may have a planar shape same as or similar to the another shape. That is, the outer and inner sidewalls of the first initial charge blocking layer 142 may have angled portions corresponding to the angled portions of the channel holes 130.

Figure 5A:
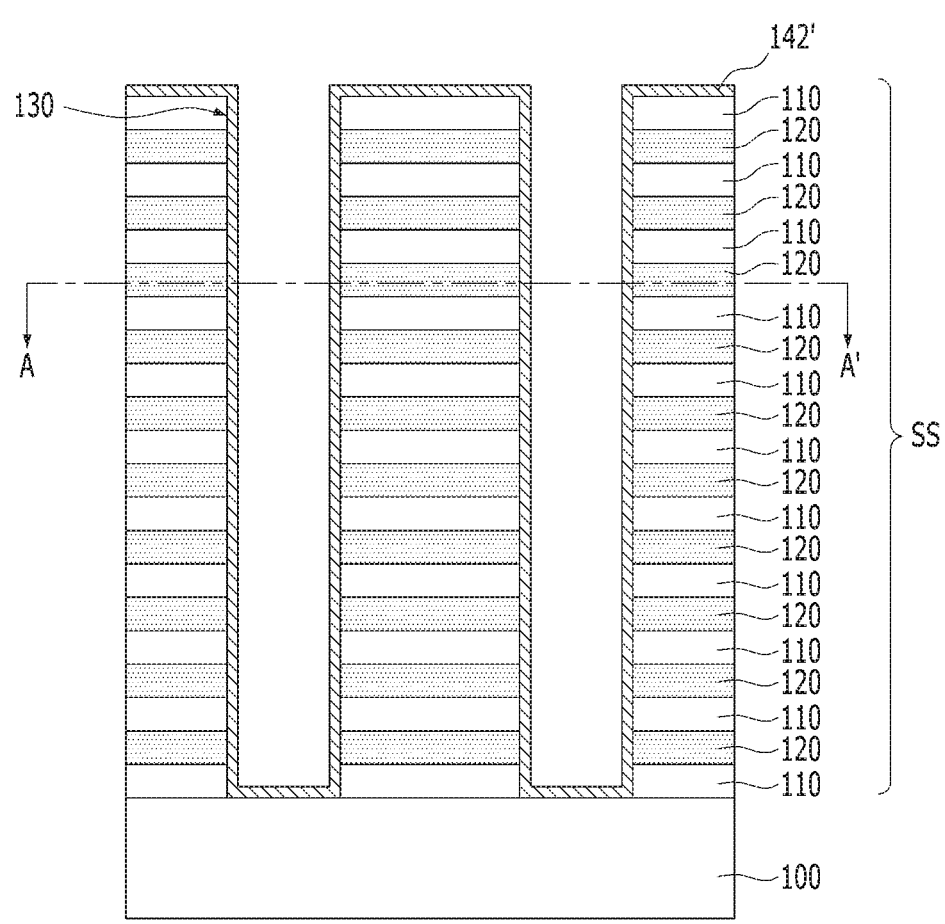
Figure 5B:
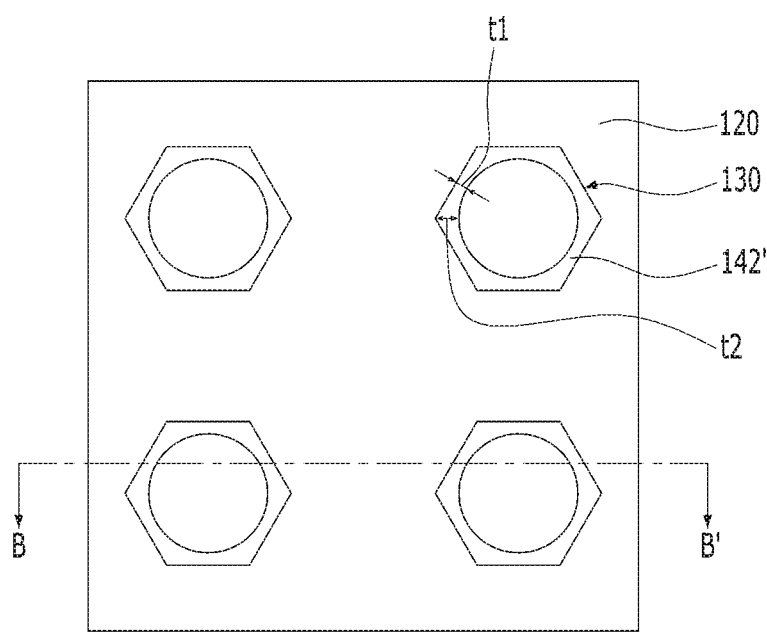

Referring to FIGS. 5A and 5B, a trimming process may be performed on the first initial charge blocking layer 142. The trimming process may be performed using a wet chemical. By this trimming process, the angular portion of the inner sidewall of the first initial charge blocking layer 142 may be removed in a plan view while a thickness of the first initial charge blocking layer 142 is reduced. Hereinafter, the trimmed first initial charge blocking layer may be referred to as a first middle charge blocking layer 142'.

The inner sidewall of the first middle charge blocking layer 142' may have a circular shape or a round shape similar to the circular shape because the angled portions are removed from the inner sidewall of the first initial charge blocking layer 142. On the other hand, the outer sidewall of the first middle charge blocking layer 142' may have the same shape as that before the trimming process, for example, a hexagonal shape. Accordingly, the first middle charge blocking layer 142' may include a portion having a relatively thin thickness (see t1) and a portion having a relatively thick thickness (see t2). That is, the thickness of the first middle charge blocking layer 142' may not be constant. However, this difference in thickness may be compensated in the subsequent oxidation process of FIGS. 6A and 6B.

Figure 6A:
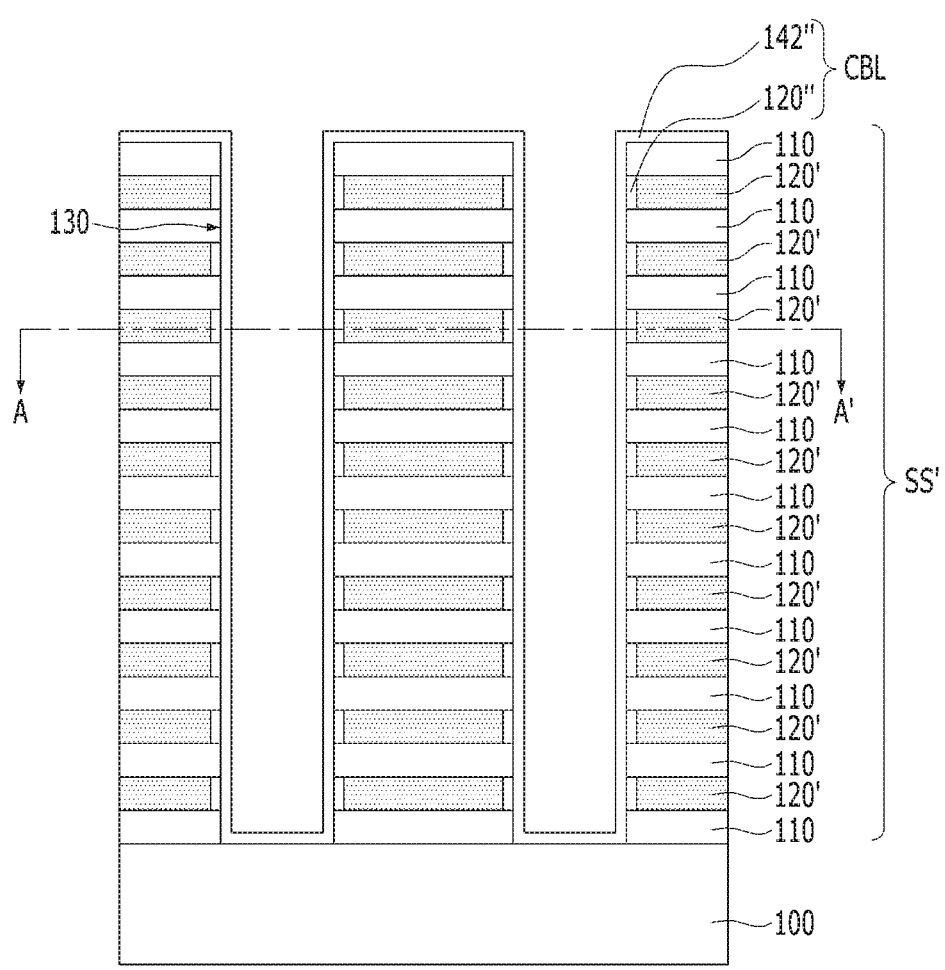
Figure 6B:
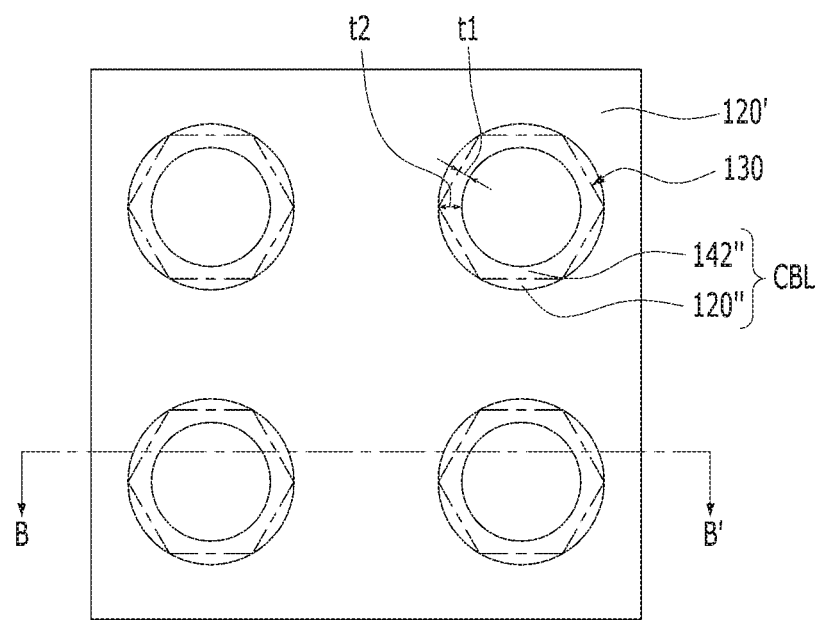

Referring to FIGS. 6A and 6B, an oxidation process may be performed on the resultant structure of FIGS. 5A and 5B. The oxidation process may be performed until the whole of the first middle charge blocking layer 142' is oxidized. Since the first middle charge blocking layer 142' has different thicknesses due to the difference in shape between the inner sidewall and the outer sidewall, the whole of the first middle charge blocking layer 142° may be oxidized when the oxidation process is performed based on the thick portion t2 of the first middle charge blocking layer 142'.

Since a rate at which oxidation proceeds from the inner sidewall of the first middle charge blocking layer 142' during the oxidation process is relatively constant, a portion of the thick portion t2 of the first middle charge blocking layer 142' may remain without being oxidized at the time when the thin portion t1 of the first middle charge blocking layer 142' is fully oxidized. While the remaining portion of the thick portion t2 of the first middle charge blocking layer 142' is oxidized, the sacrificial layer 120 adjacent to the thin portion t1 of the first middle charge blocking layer 142' may be further oxidized. Hereinafter, the oxidized first middle charge blocking layer may be referred to as a first charge blocking layer 142" and the oxidized portion of the sacrificial layer 120, which serves as a charge blocking layer together with the first charge blocking layer 142", may be referred to a second charge blocking layer 120". Also, the first charge blocking layer 142" and the second charge blocking layer 120" may be referred together as a charge blocking layer CBL. The charge blocking layer CBL may function to block charge transfer between a gate electrode and a charge storage layer, which will be described later.

Since the first initial charge blocking layer 142 includes a material having an insulating property by oxidation, the first charge blocking layer 142" may include an insulating oxide. As an example, when the first initial charge blocking layer 142 comprises a silicon-containing material, the first charge blocking layer 142" may comprise a silicon oxide. Optionally, the first charge blocking layer 142" may comprise a silicon oxide further including nitrogen or germanium.

Since the sacrificial layer 120 includes a material having an insulating property by oxidation, the second charge blocking layer 120" may include an insulating oxide. As an example, when the sacrificial layer 120 comprises a silicon-containing material, the second charge blocking layer 120" may comprise a silicon oxide. Optionally, the second charge blocking layer 120" may comprise a silicon oxide further including nitrogen or germanium. As an example, the first charge blocking layer 142" and the second charge blocking layer 120" may be formed of the same material, for example, a silicon oxide or a silicon oxide further including nitrogen, germanium, and the like. On the other hand, as another example, the first charge blocking layer 142" and the second charge blocking layer 120" may be formed of different materials. For example, the first charge blocking layer 142" may be formed of a silicon oxide further comprising nitrogen or germanium and the second charge blocking layer 120" may be formed of a silicon oxide, or vice versa.

The remaining portion of the sacrificial layer 120 which is not oxidized may be referred to as a sacrificial layer pattern 120'. The stacked structure of the sacrificial layer patterns 120' and the interlayer insulating layers 110 may be denoted by 'SS'.

Meanwhile, during this oxidation process, the interlayer insulating layer 110 adjacent to the thin portion t1 of the first middle charge blocking layer 142' may also be oxidized while the remaining portion of the thick portion t2 of the first middle charge blocking layer 142' is oxidized. However, when the interlayer insulating layer 110 is an oxide, the interlayer insulating layer 110 does not change by this oxidation process. Even if the interlayer insulating layer 110 is not an oxide, the oxidized portion of the interlayer insulating layer 110 may maintain its original function, that is, an interlayer insulating function. Therefore, the detailed description thereof and the illustration may be omitted.

Figure 7A:
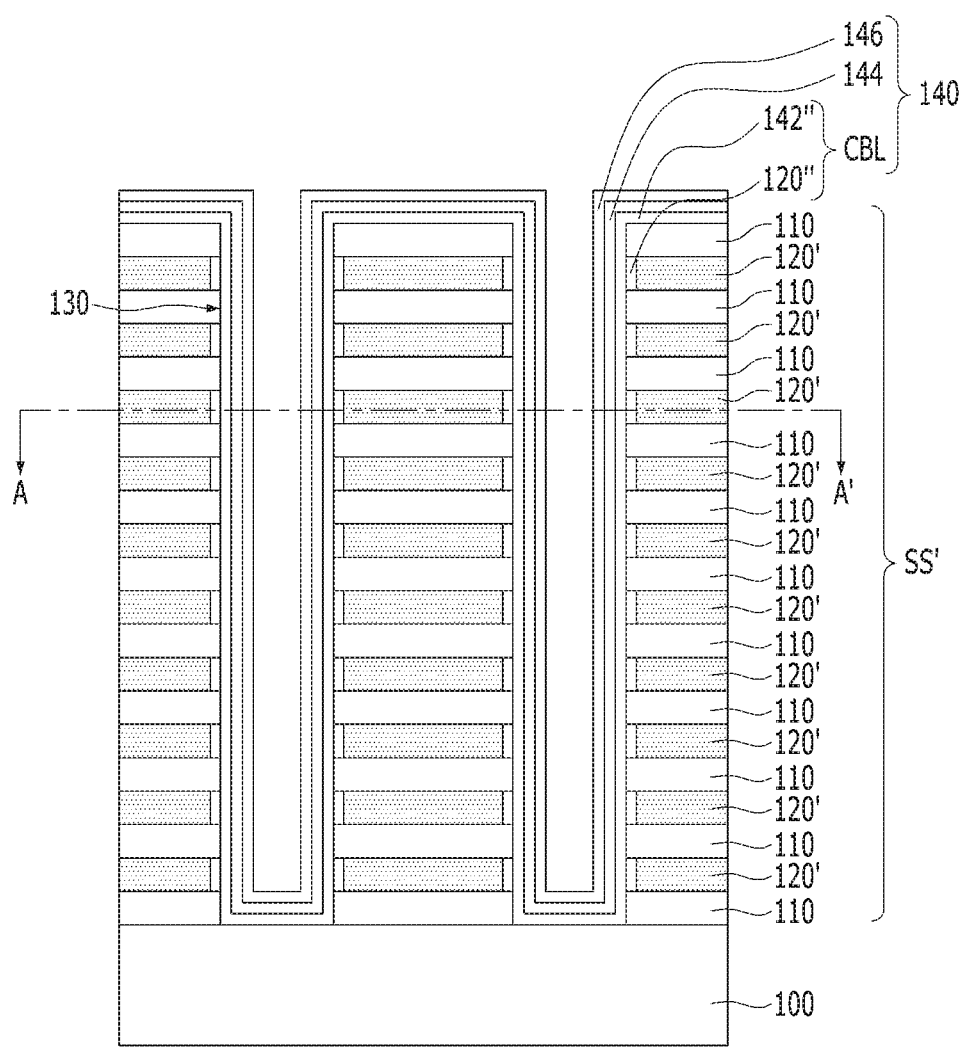
Figure 7B:
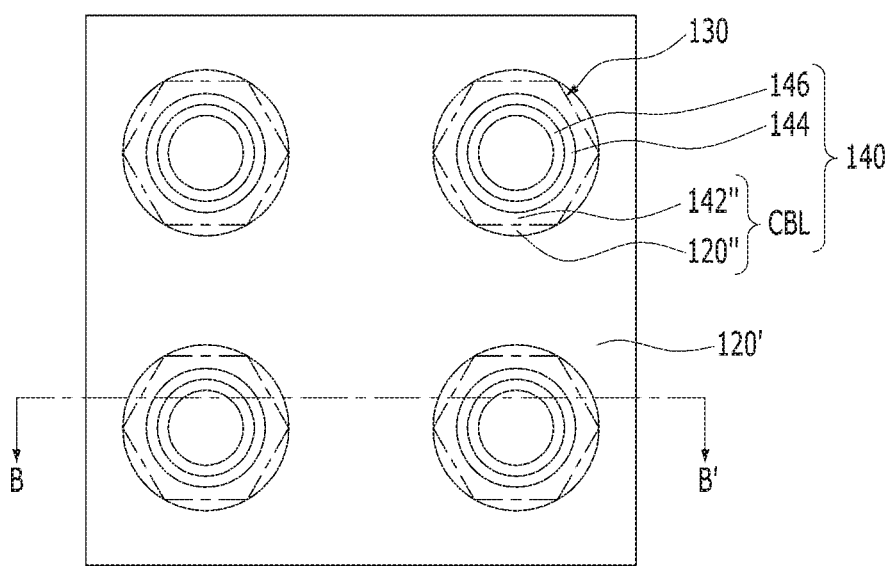

Referring to FIGS. 7A and 7B, a charge storage layer 144 and a tunnel insulating layer 146 may be sequentially formed along the surface of the charge blocking layer CBL. The charge storage layer 144 may be a layer capable of storing charges, and may be formed of a silicon nitride or the like. The tunnel insulating layer 146 may be a layer which enables tunneling of charges between a channel pillar, which will be described later, and a charge storage layer 144, and may be formed of a silicon oxide or the like. The charge storage layer 144 and the tunnel insulating layer 146 may be formed to have a small thickness that does not completely fill the channel hole 130.

Hereinafter, the charge blocking layer CBL, the charge storage layer 144, and the tunnel insulating layer 146 may be referred to as a memory layer 140. In this memory device, data may be written by discharging the charges in the charge storage layer 144 to the channel pillar or storing the charges received from the channel pillar in the charge storage layer 144 according to the bias applied to the gate electrode.

Figure 8A:
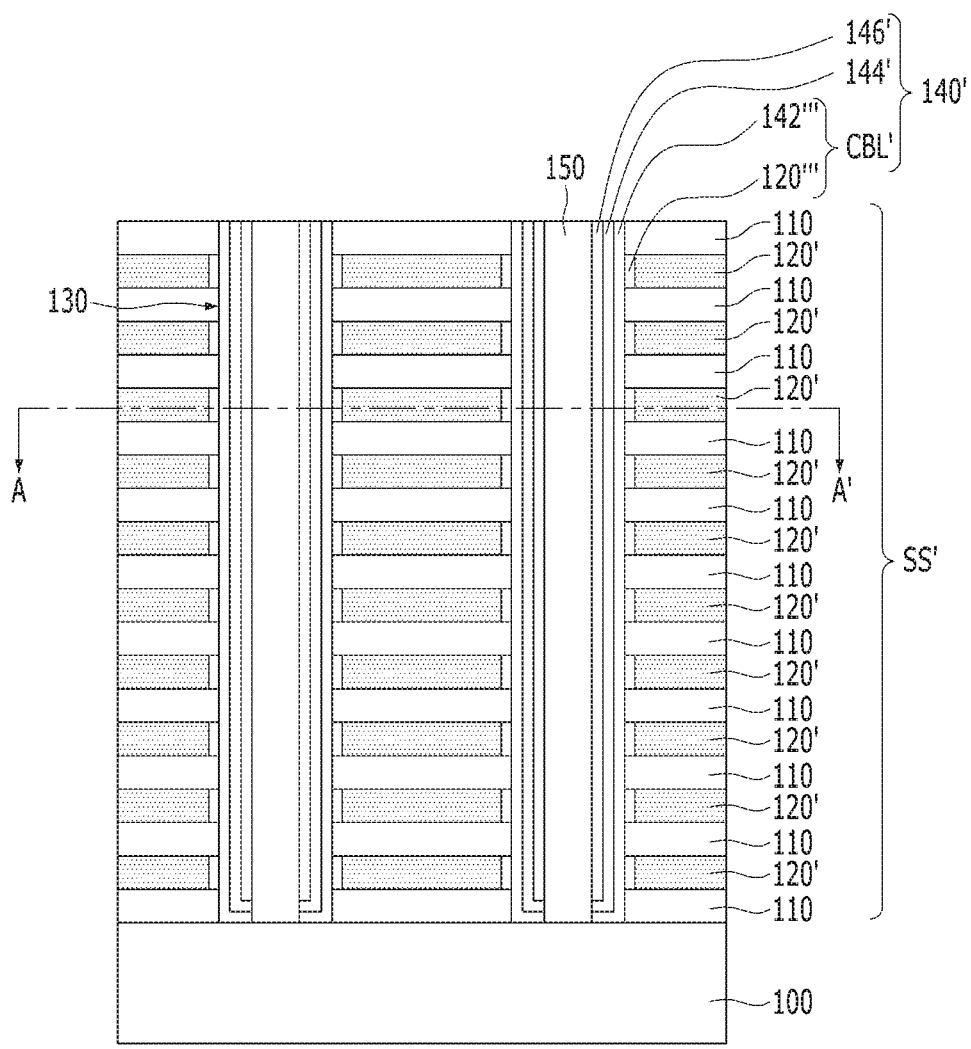
Figure 8B:
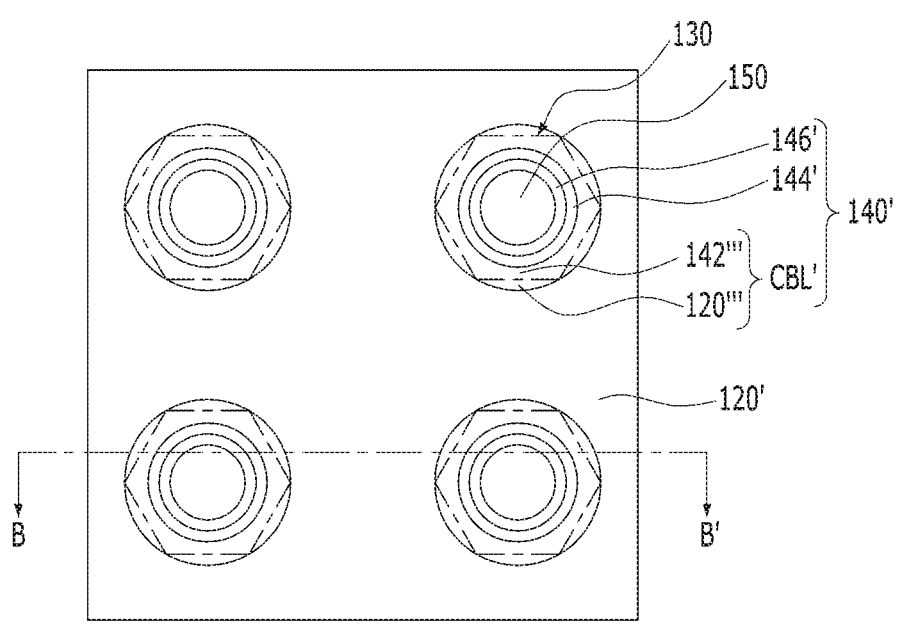

Referring to FIGS. 8A and 8B, a blanket etching may be performed on the memory layer 140 to expose the substrate 100 of the bottom surface of the channel hole 130. As a result, a portion of the memory layer 140, which is located over the bottom surface of the channel hole 130 and over the top surface of the stacked structure SS', may be removed, and a portion of the memory layer 140, which is located over the sidewall of the channel hole 130, may remain. The memory layer located over the sidewall of the channel hole 130 may be referred to as a memory layer pattern 140'. The memory layer pattern 140' may include a charge blocking layer pattern CBL, a charge storage layer pattern 144' and a tunnel insulating layer pattern 146'. The charge blocking layer pattern CBL' may include a first charge blocking layer pattern 142''' and a second charge blocking layer pattern 120'''.

In this embodiment, the charge blocking layer CBL, the charge storage layer 144, and the tunnel insulating layer 146 are all formed, and then, they are collectively etched to expose the substrate 100 of the bottom surface of the channel hole 130, but other embodiments may be possible. For example, a blanket etching process may be performed after a forming process of each of the charge blocking layer CBL, the charge storage layer 144, and the tunnel insulating layer. Specifically, after the process of FIGS. 4A and 4B, a blanket etching may be performed on the first initial charge blocking layer 142 to remain only over the sidewall of the channel hole 130, and then, subsequent processes may be performed. Alternatively, after the process of FIGS. 5A and 5B, a blanket etching may be performed on the first middle charge blocking layer 142' to remain only over the sidewall of the channel hole 130. Alternatively, after the process of FIGS. 6A and 6B, a blanket etching may be performed on the first charge blocking layer 142" to remain only over the sidewall of the channel hole 130. In addition, a blanket etching may be performed on the charge storage layer 144 immediately after the charge storage layer 144 is formed, or a blanket etching may be performed on the tunnel insulating layer 146 immediately after the tunnel insulating layer 146 is formed. Alternatively, a blanket etching may be performed on the charge storage layer 144 and the tunnel insulating layer 146 immediately after the charge storage layer 144 and the tunnel insulating layer 146 are formed.

Next, a channel pillar 150 may be formed for filling the channel hole 130 in which the memory layer pattern 140' is formed. The channel pillar 150 may have a columnar shape extending in the direction perpendicular to the substrate 100. The channel pillar 150 may be formed by forming a semiconductor material such as a silicon with a thickness enough to fill the channel hole 130 in which the memory layer pattern 140' is formed, and then, performing a planarization process, for example, a CMP (Chemical Mechanical Polishing) process until the top surface of the stacked structure SS' is exposed.

Figure 9A:
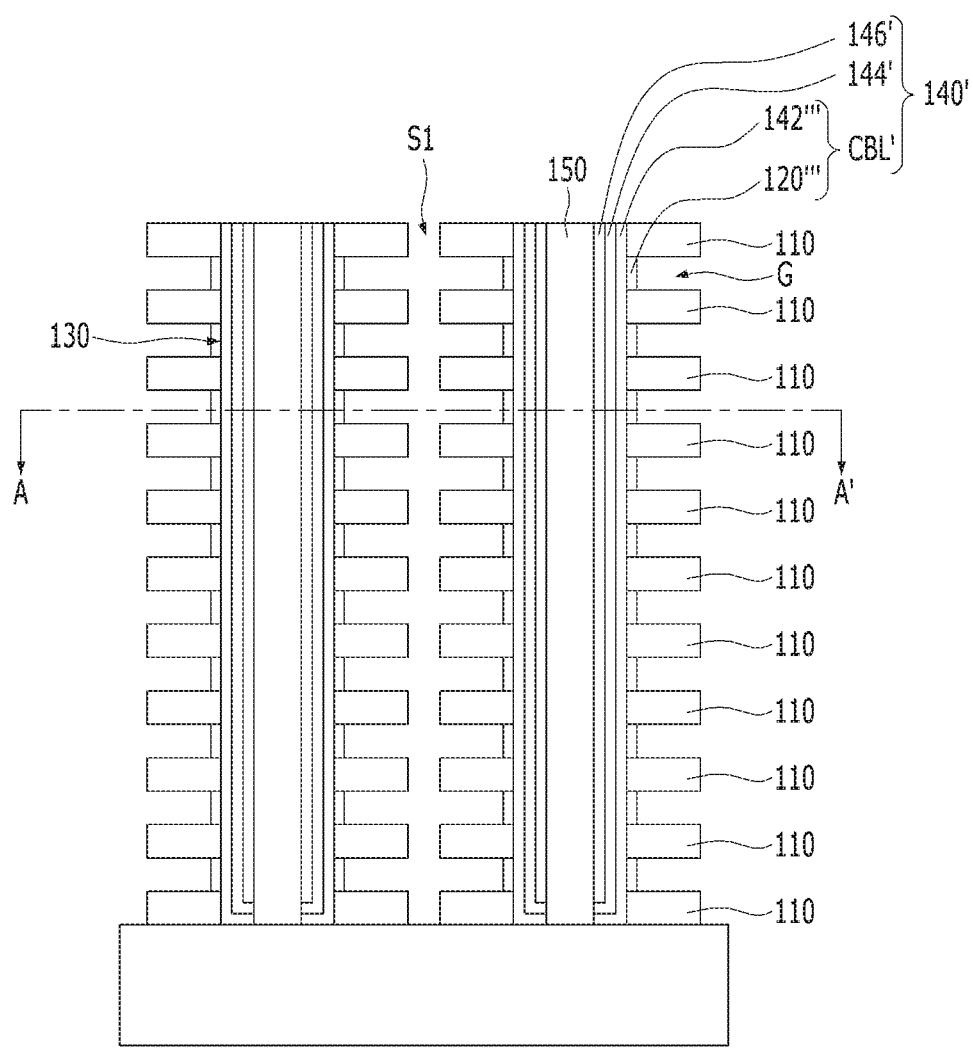
Figure 9B:
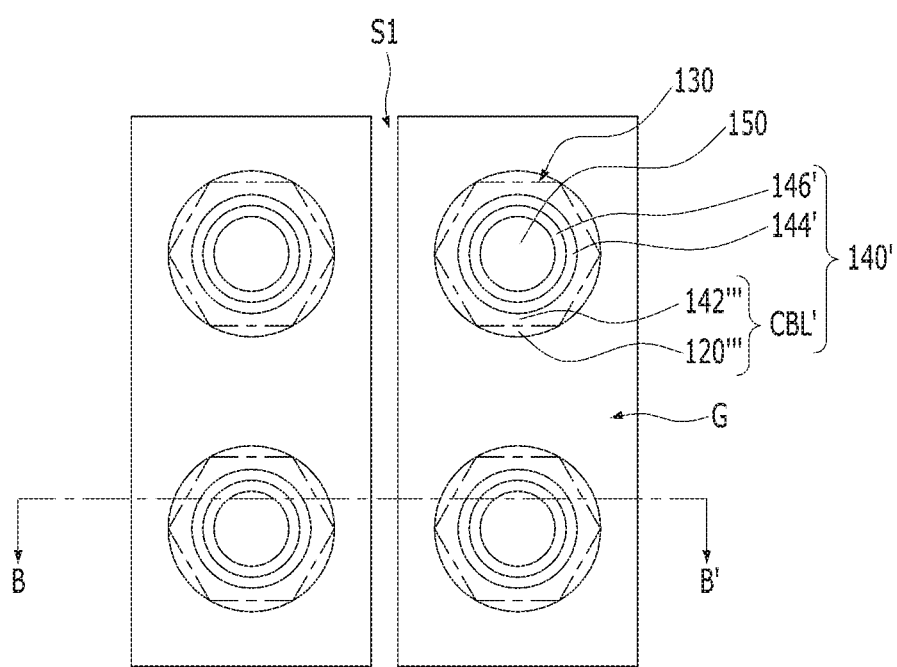

Referring to FIGS. 9A and 9B, a slit S1 extending in a direction intersecting the B-B' line may be formed between a row of channel pillars CP arranged in the second direction and an adjacent row of the channel pillars CP. The slit S1 may be formed by forming a mask pattern (not shown) that exposes a region where the slit S1 is to be formed and covers the rest, and etching the stacked structure SS' of the sacrificial layer patterns 120' and the interlayer insulating layers 110 using the mask pattern as an etching barrier. The slit S1 may be formed to a depth penetrating through the stacked structure SS'. The stacked structure SS' may be separated into two parts in a direction parallel to the B-B' line by one slit S1.

Next, the sacrificial layer pattern 120' exposed by the slit S1 may be removed. The removal of the sacrificial layer pattern 120' may be performed by an isotropic etching process such as a wet etching. The space formed by the removal of the sacrificial layer pattern 120' may be referred to as a groove G, hereinafter. The groove G may be formed to surround the channel pillar 150 while being positioned between the adjacent interlayer insulating layers 110 in the vertical direction.

Figure 10A:
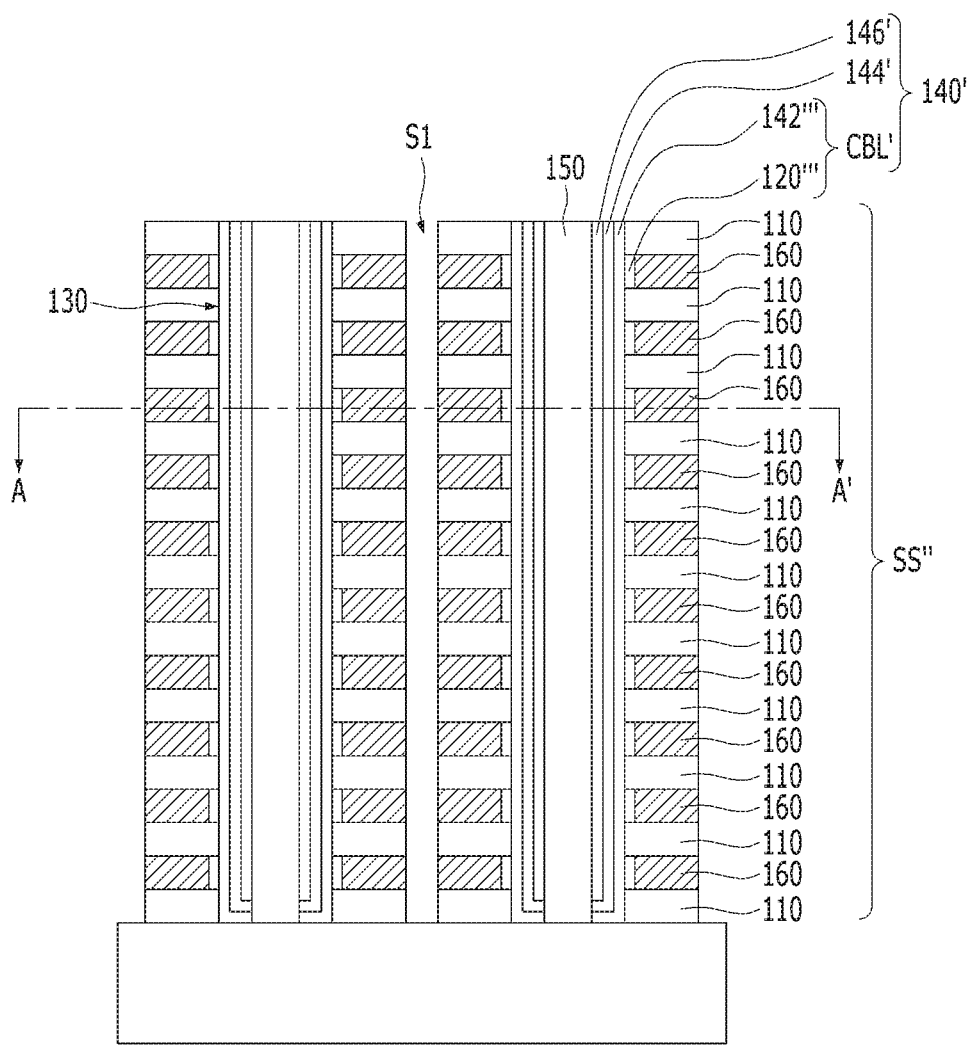
Figure 10B:
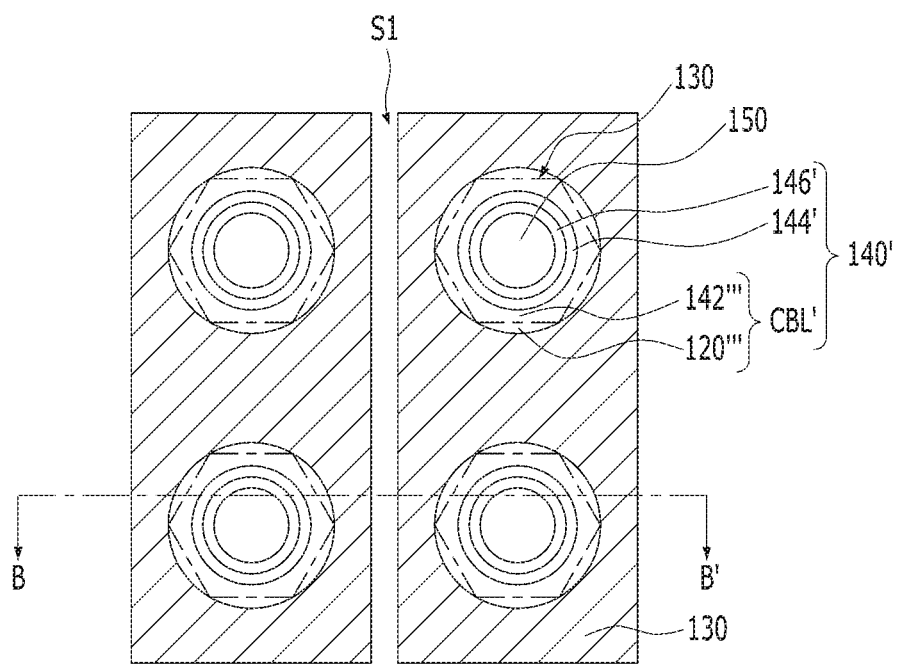

Referring to FIGS. 10A and 10B, a gate electrode layer 160 may be formed to fill in the groove G. The gate electrode layer 160 may be formed by depositing a conductive material with a thickness enough to fill the groove G along the resultant structure of FIGS. 9A and 9B, and performing a blanket etching on the conductive material such that the conductive material exists only in the groove G. The gate electrode layer 160 may comprise a metal, a conductive metal nitride, or a combination thereof.

Subsequently, although not shown, via well-known subsequent processes such as a drain contact formation process, a bit line formation process, and the like may be performed.

By the processes described above, the NVM device as shown in FIGS. 10A and 10B may be fabricated.

Referring again to FIGS. 10A and 10B, the NVM device in accordance with an embodiment of the present disclosure may include the stacked structure SS" in which the interlayer insulating layers 110 and gate electrode layers 160 are alternately stacked over the substrate 100, the channel pillar 150 penetrating through the stacked structure SS" and extending in the vertical direction, and the memory layer pattern 140' interposed between the channel pillar 150 and the stacked structure SS". The stacked structures SS" may be separated by the slit S1.

Here, the memory layer pattern 140' may include the charge blocking layer pattern CBL', the charge storage layer pattern 144', and the tunnel insulating layer pattern 146' which are sequentially arranged from a side of the stacked structure SS". In particular, the charge blocking layer pattern CBL' may include the first charge blocking layer pattern 142''' and the second charge blocking layer pattern 120'''. The first charge blocking layer pattern 142' may not be uniform in thickness. For example, the first charge blocking layer pattern 142' may include a portion having a relatively thick thickness and another portion having a relatively thin thickness. The second charge blocking layer pattern 120''' may be interposed between the first charge blocking layer pattern 142''' and the gate electrode layer 160 while being adjacent to the thinner portion of the first charge blocking layer pattern 142'''. The second charge blocking layer pattern 120''' may not exist between the thicker portion of the first charge blocking layer pattern 142''' and the gate electrode layer 160. This charge blocking layer pattern CBL' may be obtained because of the following reason.

The channel hole 130 may have a planar shape having an angled portion at a predetermined height, for example, a hexagonal shape as shown. However, the outer and inner sidewalls of the charge blocking layer pattern CBL' which is first formed in the channel hole 130 may have substantially uniform thickness without including an angled portion. In other words, a sum of the thicknesses of the first charge blocking layer pattern 142''' and the second charge blocking layer pattern 120''' may be substantially constant. Specifically, the first charge blocking layer pattern 142' may have a relatively round inner sidewall by the trimming process while having a relatively angled outer sidewall obtained by the oxidation process on the first middle charge blocking layer 142' which is formed along the channel hole 130 and has an angled portion. On the other hand, since the second charge blocking layer pattern 120''' is obtained by oxidizing the sacrificial layer 120 adjacent to the thinner portion of the first middle charge blocking layer 142' during the oxidation of the first middle charge blocking layer 142', the angular outer sidewall of the first charge blocking layer pattern 142''' may be complemented. Since the charge storage layer pattern 144' and the tunnel insulating layer pattern 146' are formed along the inner sidewall of the charge blocking layer pattern CBL', they may have a substantially uniform thickness without including angled portions.

The first charge blocking layer pattern 142''' and the second charge blocking layer pattern 120''' may include the same insulating oxide such as a silicon oxide. However, as long as the first charge blocking layer pattern 142''' and the second charge blocking layer pattern 120' are insulating oxides, they may include different materials.

One channel pillar 150, one gate electrode layer 160 surrounding it, and a memory layer pattern 140' interposed therebetween may form one memory cell. Charges may be injected from the channel pillar 150 into the charge storage layer pattern 144' or the charges of the charge storage layer pattern 144' may be discharged into the channel pillar 150 according to the bias applied to the gate electrode layer 160, and thus, different data may be stored in the memory cell.

According to the NVM device and the manufacturing method thereof described above, the following advantages may be obtained.

First, although the channel hole 130 has angled portions in a plan view, the charge blocking layer pattern CBL', the charge storage layer pattern 144', and the tunnel insulating layer pattern 146' formed along the inner sidewall thereof may not have angled portions and a thickness of each of the charge blocking layer pattern CBL', the charge storage layer pattern 144', and the tunnel insulating layer pattern 146' may be uniform. Therefore, operating characteristics of the memory cells may be improved.

Also, since the planar shape of the channel hole 130 varies according to a height, the thickness of the first initial charge blocking layer 142 and the first middle charge blocking layer 142' may vary depending on the height. However, this difference in thickness may be compensated during the subsequent oxidation process. While the thicker portion of the first middle charge blocking layer 142' is oxidized, the sacrificial layer 120 adjacent to the thinner portion of the first middle charge blocking layer 142' may be oxidized so as to function as a charge blocking layer together with the oxidized first middle charge blocking layer 142'. Therefore, the uniformity of the characteristics of the memory cells may be secured.

Furthermore, since the shape of the channel hole 130 does not affect the shape of the memory layer pattern 140', the etching depth for forming the channel hole 130 may be increased. In other words, the number of memory cells stacked vertically over the substrate 100 may be increased. As a result, a degree of integration of the NVM device may be increased without process restrictions.

Furthermore, since the above effects are achieved by an easy process such as a trimming process and an oxidation process, the process difficulty may not increase.

On the other hand, the NVM device and the manufacturing method thereof of the above-described embodiments may be variously modified.

For example, the gate electrode layer 160 may be directly deposited instead of the sacrificial layer 120 in the step of forming the stacked structure SS of FIGS. 3A and 3B. In this case, the gate electrode layer 160 may include a conductive material that is transformed to have an insulating property upon oxidation. As an example, when the gate electrode layer 160 includes a metal, an oxide of this metal may have an insulating property. Accordingly, the second charge blocking layer 120'' formed in the process of the FIGS. 6A and 6B may be an oxide of the gate electrode layer 160. Subsequent processes may be substantially the same as the above-described embodiment, except that groove formation is omitted in the process of FIGS. 9A and 9B.

Figure 11:
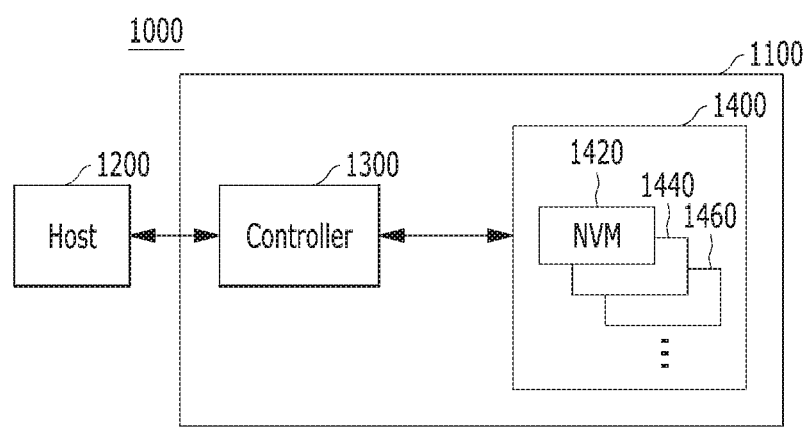
FIG. 11 is an example of a configuration diagram of a data processing system for implementing a memory device in accordance with an embodiment of the present disclosure.

The memory circuit or semiconductor device of the above embodiments may be used in various devices or systems. FIG. 11 shows an example of an apparatus or system capable of implementing the memory circuit or semiconductor device of the above-described embodiments.

FIG. 11 is an example of a configuration diagram of a data processing system for implementing a memory device in accordance with an embodiment of the present disclosure.

Referring to FIG. 11, the data processing system 1000 may include a host 1200 and a memory system 1100.

The host 1200 may include wire or wireless electronic devices. For example, the host 1200 may include portable electronic devices such as a mobile phone, an MP3 player, a laptop computer, or the like, or electronic devices such as a desktop computer, a game machine, TV, a projector, or the like.

In addition, the host 1200 may include at least one operating system (OS). The operating system may generally manage and control functions and operations of the host 1200 and provide interoperability between the host 1200 and a user using the data processing system 1000 or the memory system 1100. Here, the operating system may support functions and operations corresponding to a use purpose of the user, and may be classified into a general operating system and a mobile operating system according to the mobility of the host 1200, for example. The general operating system may be classified into a personal operating system and an enterprise operating system according to a user's usage environment. The personal operating system may be a system that is characterized to support a service providing function for a general user, and may include, for example, windows, chrome, and the like. The enterprise operating system may a system that is characterized to secure and support high performance, and may include, for example, a windows server, Linux, Unix, and the like. The mobile operating system may be a system that is characterized to support a mobility service provisioning function and a power saving function to users, and may include, for example, android, iOS, windows mobile, and the like. The host 1200 may include a plurality of operating systems and may execute these operating systems for performing operations with the memory system 1100 corresponding to a user's request.

The memory system 1100 may operate in response to a request from the host 1200, and specifically, may store data accessed by the host 1200. In other words, the memory system 1100 may be used as a main memory or an auxiliary memory of the host 1200. Here, the memory system 1100 may be implemented as any one of various types of storage devices according to a host interface protocol connected to the host 1200. For example, the memory system 1100 may be implemented as any one of a solid state drive (SSD), a multimedia card (MMC) such as a MMC, an embedded MMC (eMMC), a reduced size MMC (RS-MMC) or a micro-MMC, a secure digital (SD) card such as an SD, a mini-SD or a micro-SD, a universal storage bus (USB) storage device, a universal flash storage (UFS) device, a compact flash (CF) card, a smart media card, a memory stick, and the like.

The memory system 1100 may include a memory device 1400 for storing data accessed by the host 1200 and a controller 1300 that controls data storage in the memory device 1400.

Here, the controller 1300 and the memory device 1400 may be integrated into one semiconductor device. For example, the controller 1300 and the memory device 1400 may be integrated into one semiconductor device to configure an SSD. When the memory system 1100 is used as an SSD, an operating speed of the host 1200 connected to the memory system 1100 may be further improved. Alternatively, for example, the controller 1300 and the memory device 1400 may be integrated into one semiconductor device to configure a memory card such as a personal computer (PC) card, a compact flash (CF) card, a smart media (SM) card, a memory stick, a multimedia card such as an MMC, an RS-MMC or a mirco-MMC, an SD card such as an SD, a mini-SD, a micro-SD or a secure digital high capacity (SDRC), a universal flash storage (UFS), or the like. Alternatively, for example, the memory system 1100 may configure a computer, a ultra mobile PC (UMPC), a workstation, a netbook, a personal digital assistants (PDA), a portable computer, a web tablet, a table computer, a wireless phone, a mobile phone, a smart phone, an e-book, a portable multimedia player (PMP), a portable game machine, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage constituting a data center, a device capable of transmitting and receiving information in a wireless environment, one of various electronic devices constituting a home network, one of various electronic devices constituting a computer network, one of various electronic devices constituting a telematics network, a radio frequency identification device (RFID), or one of various components constituting a computing system.

The memory device 1400 in the memory system 1100 may maintain the stored data even when no power is supplied, and specially, may store data provided from the host 1200 via a write operation and provide the stored data to the host 1200 via a read operation. Here, the memory device 1400 may include a plurality of memories 1420, 1440 and 1460. Each of the plurality of memories 1420, 1440 and 1460 may include the three-dimensional NVM device of the above-described embodiments. For example, each of the plurality of memories 1420, 1440 and 1460 may include: a stacked structure formed over a substrate and including a plurality of interlayer insulating layers and a plurality of gate electrode layers which are alternately stacked; a channel pillar penetrating through the stacked structure; a tunnel insulating layer, a charge storage layer and a first charge blocking layer which are interposed between the channel pillar and the stacked structure and are arranged from a side closer to the channel pillar, the first charge blocking layer including a first portion having a relatively thick thickness and a second portion having a relatively thin thickness; and a second charge blocking layer interposed between the first charge blocking layer and the gate electrode layer to be in contact with the second portion. Thereby, a degree of integration of the memory device 1400 may increase, and characteristics of memory cells may be improved and uniformized. Thereby, data storage capacity of the memory system 1100 may be increased and operating characteristics or the memory system 1100 may be improved. As a result, data processing characteristics of the data processing system 1000 may be improved.

The controller 1300 in the memory system 1100 may control the memory device 1400 in response to a request from the host 1200. For example, the controller 1300 may provide the data read from the memory device 1400 to the host 1200 and store the data provided from the host 1200 in the memory device 1400. To this end, the controller 1300 may control operations such as read, write, program, erase, etc.

For the above operations, the controller 1300 may include an interface unit for communication with the host 1200, an interface unit for communication with the memory device 1400, an operating memory for storing data for operations of the controller 1300 and/or the memory system 1100, a processor for controlling overall operations of the controller 1300 and/or the memory system 1100, and for this purpose, including a firmware such as a flash translation layer (FTL) and implemented as a microprocessor or a central processing unit (CPU), or the like.

However, a system in which the memory circuit or the semiconductor device of the above-described embodiments can be used is not limited to the system of FIG. 11. The memory circuit or the semiconductor device of the above-described embodiments may be provided in various systems requiring a non-volatile memory.

Although various embodiments have been described for illustrative purposes, it will be apparent to those skilled in the art that various changes and modifications may be made without departing from the spirit and scope of the invention as defined in the following claims.

What is claimed is:

1. A method for fabricating a non-volatile memory device, comprising:
   forming a stacked structure including a plurality of interlayer insulating layers and a plurality of first material layers which are alternately stacked;
   forming at least one channel hole penetrating through the stack structure;
   forming a second material layer along the at least one channel hole;
   trimming a surface of the second material layer so that the trimmed second material layer includes a first portion having a first thickness and a second portion having a second thickness smaller than the first thickness;
   oxidizing the trimmed second material layer until a whole of the first portion is oxidized to form at least a portion of a charge blocking layer; and
   forming a charge storage layer and a tunnel insulating layer over the charge blocking layer,
   wherein, during the oxidizing of the trimmed second material layer, a whole of the second portion is oxidized and a portion of the first material layer, which contacts the second portion, is oxidized, and
   wherein the oxidized first portion, the oxidized second portion, and the oxidized portion of the first material layer forms the charge blocking layer.

2. The method of claim 1, wherein each of the first material layer and the second material layer includes a silicon-containing material.

3. The method of claim 1, wherein each of the first material layer and the second material layer includes a silicon nitride.

4. The method of claim 1,
   wherein the first material layer and the second material layer are formed of the same material, and
   wherein the portion of the first material layer, which is oxidized, and the oxidized second material layer are formed of the same material.

5. The method of claim 1,
   wherein the first material layer and the second material layer are formed of materials different from each other, and
   wherein the portion of the first material layer which is oxidized and the oxidized second material layer are formed of the same material.

6. The method of claim 1,
   wherein the first material layer and the second material layer are formed of materials different from each other, and
   wherein the portion of the first material layer which is oxidized and the oxidized second material layer are formed of materials different from each other.

7. The method of claim 1, wherein at least a portion of the surface of the second material layer is angled, and
   the trimming is performed such that the angled portion of the surface of the second material layer is removed.

8. The method of claim 7, wherein the trimming is performed using a wet chemical.

9. The method of claim 1, wherein a planar shape of the channel hole has an angled portion at a predetermined height, and
   the second material layer formed along the channel hole is angled at a portion corresponding to the angled portion of the channel hole at the predetermined height.

10. The method of claim 1, further comprising:
forming a channel pillar filling the channel hole in which the charge storage layer and the tunnel insulating layer are formed;
forming a slit after the forming of the channel pillar;
removing the first material layer exposed by the slit; and
filling a space from which the first material layer is removed with a conductive material for forming a gate electrode.

11. The method of claim 1, wherein the first material layer includes a conductive material for forming a gate electrode.

12. The method of claim 1, wherein an oxide of the first material layer has an insulating property, and an oxide of the second material layer has an insulating property.

13. The method of claim 1, wherein a planar shape of the channel hole has an angled portion,
an outer sidewall of the second material layer formed along the channel hole has an angled portion, and
during oxidizing the trimmed second material layer, the angled portion of the outer sidewall of the second material layer is removed.

14. A method for fabricating a three-dimensional, non-volatile memory device, comprising:

forming a stacked structure including a plurality of interlayer insulating layers and a plurality of first material layers which are alternately stacked;
forming at least one channel hole penetrating through the stack structure;
forming a second material layer along an internal side surface of the at least one channel hole;
trimming the second material layer to form a plurality of alternating first and second portions, a thickness of the first portion being larger than a thickness of the second portion; and
oxidizing the trimmed second material layer until a whole of the first portion is oxidized to form a charge blocking layer,
wherein, during the oxidizing of the trimmed second material layer, a whole of the second portion is oxidized and a portion of the first material layer, which contacts the second portion, is oxidized, and
wherein the oxidized first portion, the oxidized second portion, and the oxidized portion of the first material layer forms the charge blocking layer.

* * * * *